United States Patent
Chen et al.

(10) Patent No.: US 11,205,606 B2
(45) Date of Patent: Dec. 21, 2021

(54) SEMICONDUCTOR DEVICE PACKAGE

(71) Applicant: Advanced Semiconductor Engineering, Inc., Kaohsiung (TW)

(72) Inventors: Hsin-En Chen, Kaohsiung (TW); Hung-Hsien Huang, Kaohsiung (TW); Shin-Luh Tarng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 79 days.

(21) Appl. No.: 16/730,400

(22) Filed: Dec. 30, 2019

(65) Prior Publication Data

US 2021/0202349 A1    Jul. 1, 2021

(51) Int. Cl.
*H01L 23/373* (2006.01)
*H01L 23/498* (2006.01)

(52) U.S. Cl.
CPC .... *H01L 23/3733* (2013.01); *H01L 23/49838* (2013.01); *H01L 23/49861* (2013.01)

(58) Field of Classification Search
CPC ................ H01L 23/367–3738; H01L 23/3733
See application file for complete search history.

(56) References Cited

U.S. PATENT DOCUMENTS

| 10,062,665 | B2 | 8/2018 | Chen et al. |
| 2018/0254236 | A1* | 9/2018 | Cola ........................ C09K 5/14 |
| 2019/0194518 | A1 | 6/2019 | Leolukman et al. |

\* cited by examiner

*Primary Examiner* — Tucker J Wright
(74) *Attorney, Agent, or Firm* — Foley & Lardner LLP

(57) ABSTRACT

A semiconductor device package includes a semiconductor die and an anisotropic thermal conductive structure. The semiconductor die includes a first surface, a second surface opposite to the first surface and edges connecting the first surface to the second surface. The anisotropic thermal conductive structure has different thermal conductivities in different directions. The anisotropic thermal conductive structure includes at least two pairs of film stacks, and each pair of the film stacks comprises a metal film and a nanostructural film alternately stacked. The anisotropic thermal conductive structure comprises a first thermal conductive section disposed on the first surface of the semiconductor die, and the first thermal conductive section is wider than the semiconductor die.

20 Claims, 20 Drawing Sheets

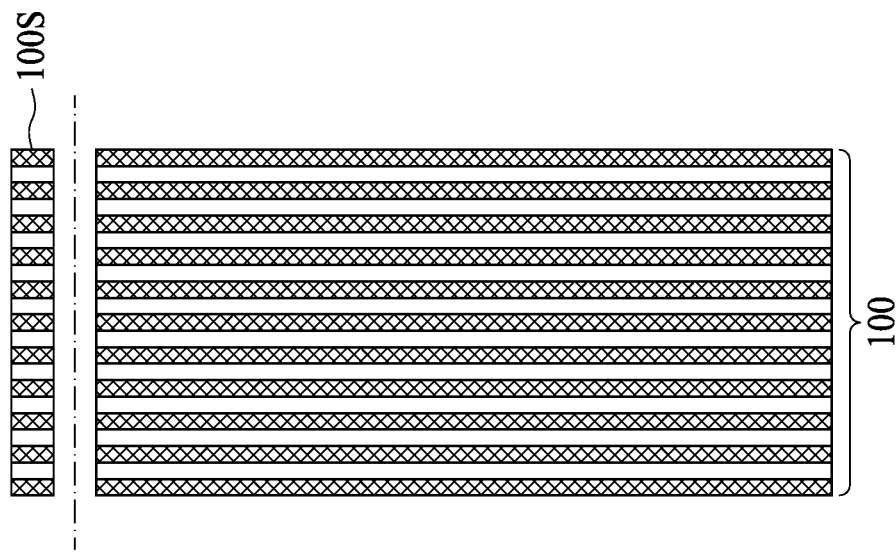

SEMICONDUCTOR DEVICE PACKAGE

BACKGROUND

1. Technical Field

The present disclosure relates to a semiconductor device package with high thermal dissipation effect and method for manufacturing the same.

2. Description of the Related Art

The semiconductor industry has seen growth in an integration density of a variety of different electronic components in a semiconductor device package. This increased integration density often results in an increased power density in the semiconductor device packages. As the power density of semiconductor device packages grows, heat dissipation becomes an issue to be addressed.

SUMMARY

In some embodiments, a semiconductor device package includes a semiconductor die and an anisotropic thermal conductive structure. The semiconductor die includes a first surface, a second surface opposite to the first surface and edges connecting the first surface to the second surface. The anisotropic thermal conductive structure has different thermal conductivities in different directions. The anisotropic thermal conductive structure includes at least two pairs of film stacks, and each pair of the film stacks comprises a metal film and a nano-structural film alternately stacked. The anisotropic thermal conductive structure comprises a first thermal conductive section disposed on the first surface of the semiconductor die, and the first thermal conductive section is wider than the semiconductor die.

In some embodiments, a semiconductor device package includes a semiconductor die, a first thermal conductive section and a second thermal conductive section. The semiconductor die includes a first surface, a second surface opposite to the first surface and edges connecting the first surface to the second surface. The first thermal conductive section is disposed on the first surface of the semiconductor die. The first thermal conductive section includes at least two pairs of film stacks, and each pair of the film stacks of the first thermal conductive section includes a metal film and a nano-structural film alternately stacked. The second thermal conductive section is adjacent to at least one of the edges of the semiconductor die and connected to the first thermal conductive section.

In some embodiments, a semiconductor device package includes a lead frame, a semiconductor die and an encapsulant. The lead frame includes a die pad, a plurality of supporting bars extending from the die pad, and a plurality of fingers spaced apart the die pad. The lead frame includes at least two pairs of film stacks, and each pair of the film stacks of the lead frame includes a metal film and a nano-structural film alternately stacked. The semiconductor die is disposed on the die pad and electrically connected to the fingers. The encapsulant encapsulates the lead frame and the semiconductor die.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 9A, FIG. 9B, FIG. 9C, FIG. 9D, FIG. 9E, FIG. 9F and FIG. 9G illustrate operations of manufacturing a semiconductor electronic device package in accordance with some embodiments of the present disclosure.

DETAILED DESCRIPTION

Figure 1:
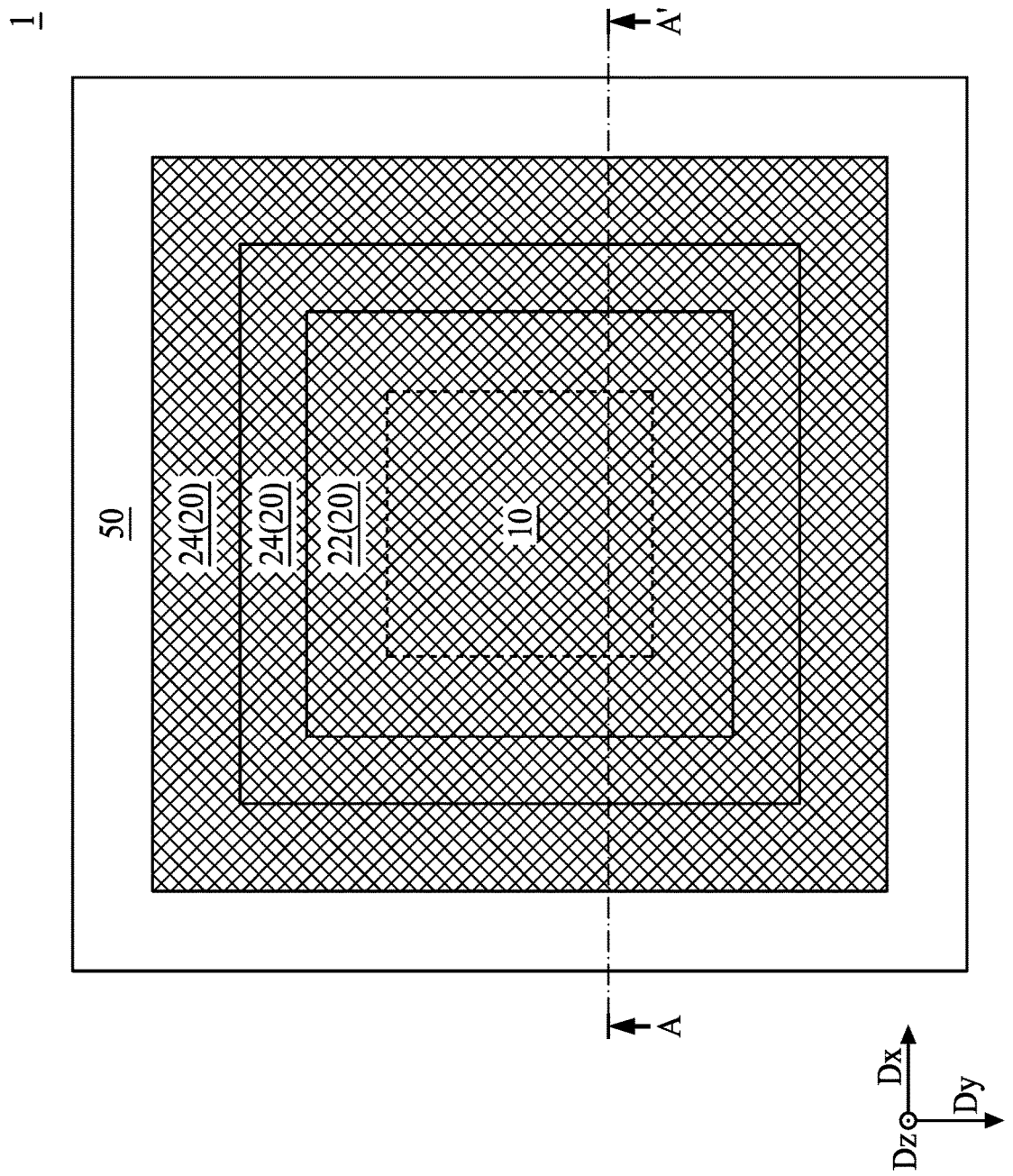
FIG. 1 is a schematic top view of a semiconductor electronic device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "active surface" may refer to a surface of a semiconductor die on which contact terminals such as contact pads are disposed, and the term "inactive surface" may refer to another surface of the semiconductor die opposite to the active surface on which no contact terminals are disposed. As used herein the term "nano-structural film" may refer to a film including or consisting essentially of nanostructures of nanometric scale. As used herein the term "anisotropic thermal conductive structure" may refer to a thermal conductive structure having a thermal conductivity in a specific direction different from that in another direction.

Some embodiments of the present disclosure provide semiconductor device packages with anisotropic thermal conductive structures. The anisotropic thermal conductive structures have anisotropic thermal conductive characteristic that helps transfer heat generated by the semiconductor die in a more efficient way with less thermal resistance, and thus heat dissipation of the semiconductor device package can be improved.

Figure 1A:
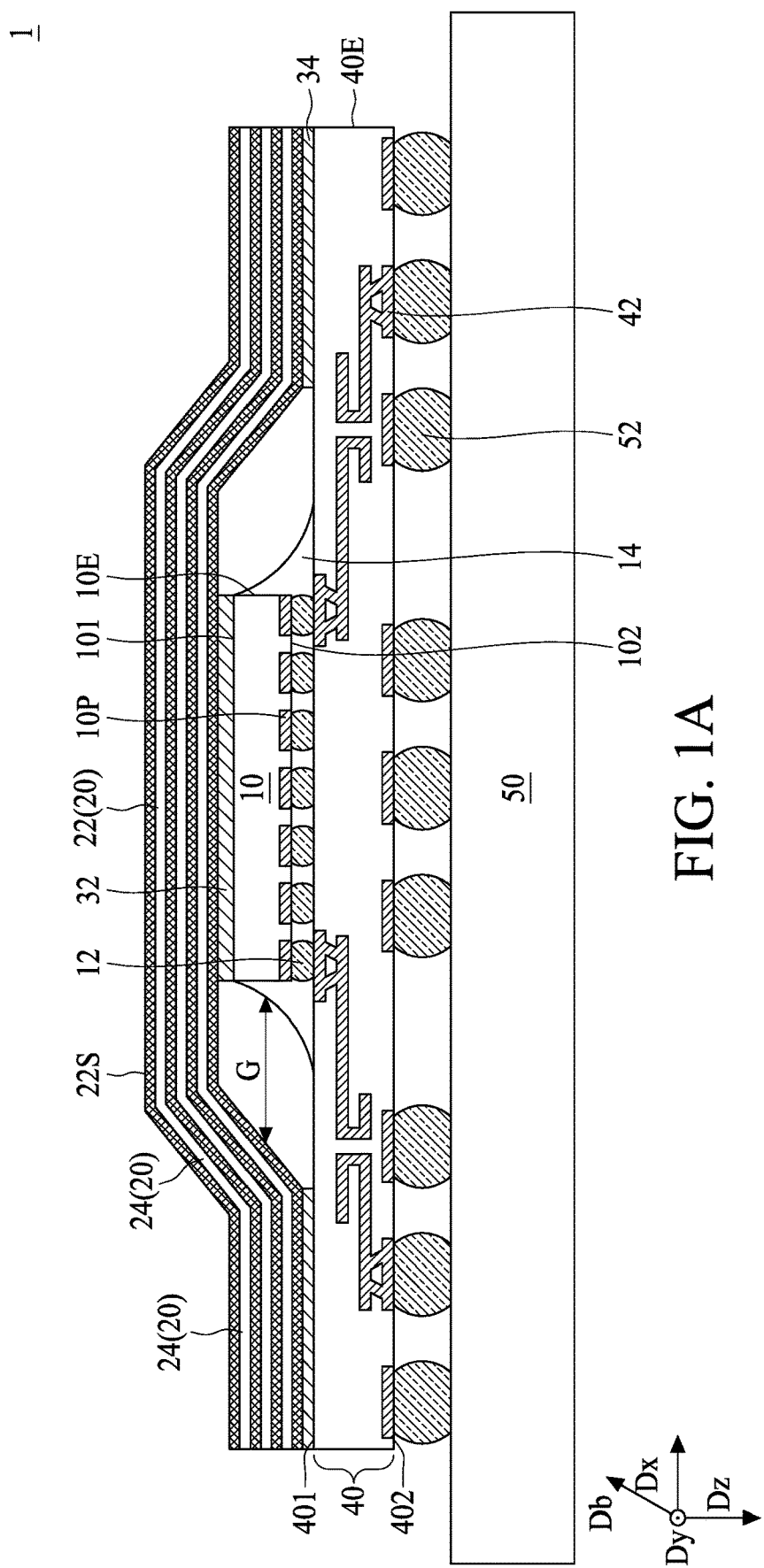
FIG. 1A is a schematic cross-sectional view of a semiconductor device package taken in a line A-A' in FIG. 1.
Figure 1B:
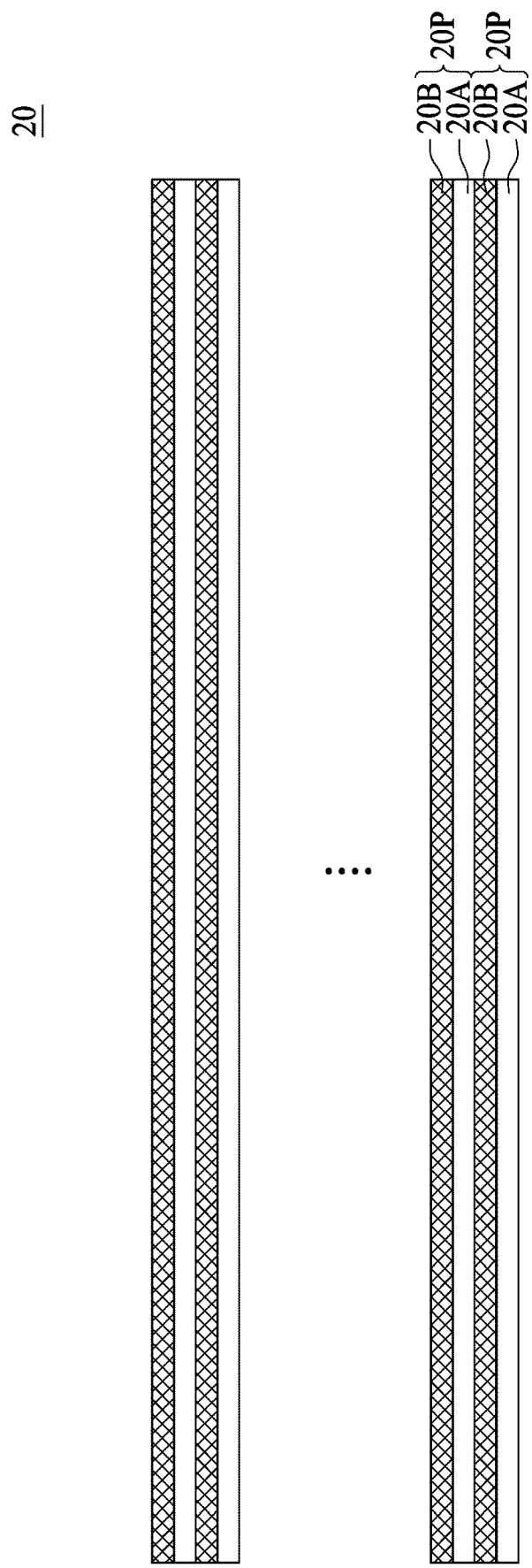
FIG. 1B is a schematic enlarged cross-sectional view of an anisotropic thermal conductive structure in accordance with some embodiments of the present disclosure.

FIG. 1 is a schematic top view of a semiconductor electronic device package 1 in accordance with some embodiments of the present disclosure, FIG. 1A is a schematic cross-sectional view of a semiconductor device package 1 taken in a line A-A' in FIG. 1, and FIG. 1B is a schematic enlarged cross-sectional view of an anisotropic thermal conductive structure 20 in accordance with some embodiments of the present disclosure. For the purpose of clarity, some components may not be shown in FIG. 1, FIG. 1A and FIG. 1B. As shown in FIG. 1, FIG. 1A and FIG. 1B, the semiconductor device package 1 includes a semiconductor die 10 and an anisotropic thermal conductive structure 20. The semiconductor die 10 includes a first surface 101, a second surface 102 opposite to the first surface 101, and edges 10E connecting the first surface 101 to the second surface 102. In some embodiments, the second surface 102 may be an active surface on which contact terminals 10P such as contact pads are disposed, and the first surface 101 may be an inactive surface on which no contact terminals are disposed. The semiconductor die 10 may include a polygonal shape such as a rectangular shape with four edges 10E. The semiconductor die 10 may include an active die such as a logic die or a system on chip (SOC), a passive die, or a combination thereof.

The anisotropic thermal conductive structure 20 has different thermal conductivities in different directions, e.g., a thermal conductivity (also referred to a coefficient of thermal conductivity) of the anisotropic thermal conductive structure 20 in a specific direction may be different from a thermal conductivity of the anisotropic thermal conductive structure 20 in another direction. The anisotropic thermal conductive structure 20 may include a plurality of sections directly or indirectly connected to each other, and the sections may have similar or different anisotropic thermal conductive characteristics. As shown in FIG. 1B, the anisotropic thermal conductive structure 20 may include at least two pairs 20P of film stacks, and each pair 20P of the film stacks includes a metal film 20A and a nano-structural film 20B alternately stacked. In some embodiments, the metal film 20A and the nano-structural film 20B have different characteristics. For example, the thermal conductivity of the nano-structural film 20B may be higher than that of the metal film 20A, and the structural strength of the metal film 20A may be higher than that of the nano-structural film 20B. The metal film 20A may be an isotropic thermal conductive film having a substantially equal thermal conductivity in different directions. The nano-structural film 20B may be an anisotropic thermal conductive film having a thermal conductivity in a specific direction different from that in another direction. The metal films 20A and the nano-structural films 20B can be stacked in different manners to make the anisotropic thermal conductive structure 20 have a higher thermal conductivity in one direction, and a lower thermal conductivity in another direction. For example, the thermal conductivity in a lateral direction may be higher than that in a vertical direction in case the nano-structural films 20B and the metal films 20A are stacked in the vertical direction. Alternatively, the thermal conductivity in the vertical direction may be higher than that in the lateral direction in case the nano-structural films 20B and the metal films 20A are stacked in the lateral direction. In some embodiments, the metal film 20A may include, but is not limited to, a copper film such as a copper foil, and the nano-structural film 20B may include, but is not limited to, a graphene film.

The anisotropic thermal conductive structure 20 includes a first thermal conductive portion 22 disposed on the first surface 101 of the semiconductor die 10. In some embodiments, the film stacks of the first thermal conductive section 22 are stacked substantially in a vertical direction Dz perpendicular to the first surface 101 of the semiconductor die 10, and a thermal conductivity of the first thermal conductive section 22 substantially in lateral directions Dx and Dy is greater than that of the first thermal conductive section 22 substantially in the vertical direction Dz. The thermal conductivity of the graphene film may be substantially equal in any lateral directions e.g., Dx and Dy in XY plane in case the film stacks of the first thermal conductive section 22 are stacked substantially in the vertical direction Dz. The first thermal conductive section 22 is wider than the semiconductor die 10 and laterally protrudes out at least one of the edges of the semiconductor die 10, such that the heat generated by the semiconductor die 10 during operation can be rapidly laterally transferred. Accordingly, the temperature of the semiconductor device package 1 during operation can be lowered. The outer surface 22S of the first thermal conductive section 22 may include an even surface. Alternatively, the outer surface 22S of the first thermal conductive section 22 may include a rough surface to increase heat dissipation efficiency. In some embodiments, an outer surface 22S of the first thermal conductive section 22 can be exposed to environment to increase thermal radiation heat transfer. The outer surface 22S of the first thermal conductive section 22 may include an even surface. Alternatively, the outer surface 22S of the first thermal conductive section 22 may include a rough surface to increase heat dissipation efficiency. In some other embodiments, the outer surface 22S of the first thermal conductive section 22 can be connected to a heat dissipation structure to further enhance heat dissipation effect. Examples of the heat dissipation structure may include heat sink, air cooling structure, water cooling structure, fan or other suitable active and/or passive type heat dissipation structures.

In some embodiments, the thermal radiation ability of the nano-structural film 20B is higher than that of the metal film 20A, and thus the nano-structural film 20B can be the exterior film of the anisotropic thermal conductive structure 20 to provide better thermal radiation effect. In some embodiments, the metal film 20A may be configured as a support film of the nano-structural film 20B, and the thickness of the metal film 20A may be larger than the thickness of the nano-structural film 20B. The thickness of the metal film 20A may be about three times thicker than the thickness of the nano-structural film 20A. For example, the thickness of the metal film 20A may be about 15 micrometers, and the thickness of the nano-structural film 20B is about 5 micrometers. The number of the pair 20P of film stacks can be modified based on structure strength and heat dissipation considerations. In some embodiments, the anisotropic thermal conductive structure 20 may include 15 or more pairs 20P of film stacks. Since the thermal conductivity and thermal radiation ability of the nano-structural film 20B are higher than that of the metal film 20A, the anisotropic thermal conductive structure 20 may include an extra nano-structural film 20B, such that the outer sides of the anisotropic thermal conductive structure 20 are both the nano-structural films 20B. By way of example, the lateral thermal conductivity of the first thermal conductive portion 22 is about 703 W/mk, and the vertical thermal conductivity of the first thermal conductive portion 22 is about 481 W/mk when the anisotropic thermal conductive structure 20 includes fifteen pairs 20P of copper films and graphene films.

In some embodiments, the semiconductor device package 1 may further include a thermal interface material (TIM) 32 disposed between the first surface 101 of the semiconductor die 10 and the first thermal conductive section 22. The thermal interface material 32 may be adhesive, and in contact with the first thermal conductive section 22 and the semiconductor die 10 to couple the first thermal conductive section 22 to the semiconductor die 10. The thermal interface material 32 may also be configured as a buffer layer to cushion the shock or force during mounting the anisotropic thermal conductive structure 20. The thermal interface material 32 may include a polymeric material. The higher and anisotropic thermal conductivity of the first thermal conductive section 22 can help compensate the thermal resistance of the thermal interface material 32, and thus can improve overall heat dissipation of the semiconductor device package 1.

The anisotropic thermal conductive structure 20 further includes a second thermal conductive section 24 adjacent to at least one of the edges 10E of the semiconductor die 10, and the second thermal conductive section 24 and the at least one of the edges 10E of the semiconductor die 10 are spaced with a gap G. In some embodiments, the second thermal conductive section 24 includes a ring structure connecting the first thermal conductive section 22 and surrounding all the edges 10E of the semiconductor die 10. In some embodiments, the first thermal conductive section 22 and the second thermal conductive section 24 may collectively form a hat structure that enclose the first surface 101 and the edges 10E of the semiconductor die 10 to provide heat dissipation as well as protection to the semiconductor die 10. In some embodiments, the film stacks of the second thermal conductive section 24 may be stacked substantially in an oblique direction Db different from the vertical direction Dz and the lateral directions Dx and Dy as the first thermal conductive section 22, and the first thermal conductive section 22 and the second thermal conductive section 24 can be integrally formed.

In some embodiments, the semiconductor device package 1 may further include a substrate 40 disposed on the second surface 102 of the semiconductor die 10. The substrate 40 includes a top surface 401 connected to the second thermal conductive section 24, a bottom surface 402 opposite to the top surface 401, and edges 40E connecting the top surface 401 to the bottom surface 402. In some embodiments, the second thermal conductive section 24 may be grounded through the substrate 40 to provide shielding effect to the semiconductor die 10. In some embodiments, the semiconductor device package 1 may further include another thermal interface material 34 disposed between the second thermal conductive section 24 and the substrate 40 to bond the second thermal conductive section 24 and the substrate 40. The thermal interface material 34 and the thermal interface material 32 may include the same or different materials.

The substrate 40 may include a circuit substrate having circuitry 42 to build external connections for the semiconductor die 10. Examples of the substrate 40 may include a package substrate, a fan-out circuit layer, a redistribution layer (RDL), an interposer or the like. In some embodiments, a plurality of conductive structures 12 such as solder bumps are disposed between and electrically connected the electrical terminals 10P of the semiconductor die 10 and the circuitry 42 of the substrate 40. In some embodiments, an encapsulant 14 such as an underfill and/or a molding compound may encapsulate the edges 10E and/or the second surface 102 of the semiconductor die 10. In some other embodiments, the first surface 101 may be an active surface, and the semiconductor die 10 may be electrically connected to the substrate 40 through wire bonding or the like.

In some embodiments, the semiconductor device package 1 may further include a circuit board 50 such as a printed circuit board (PCB) disposed on the bottom surface 402 of the substrate 40, and electrical conductors 52 such as solder balls disposed between and electrically connected to the substrate 40 and the circuit board 50.

In the aforementioned embodiments, the anisotropic thermal conductive structure 20 including multiple pairs 20P of metal films 20A and nano-structural films 20B has higher thermal conductivity in all lateral directions such as Dx and Dy in XY plane, and thus the heat generated by the semiconductor die 10 can be efficiently transferred from the first thermal conductive section 22 and the second thermal conductive section 24 to the substrate 40. In addition, the nano-structural film 20B of the anisotropic thermal conductive structure 20 has better thermal radiation effect, and thus the heat generated by the semiconductor die 10 can also be transferred by thermal radiation. Furthermore, the anisotropic thermal conductive structure 20 can further provide protection and/or shielding for the semiconductor die 10.

The semiconductor device packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2:
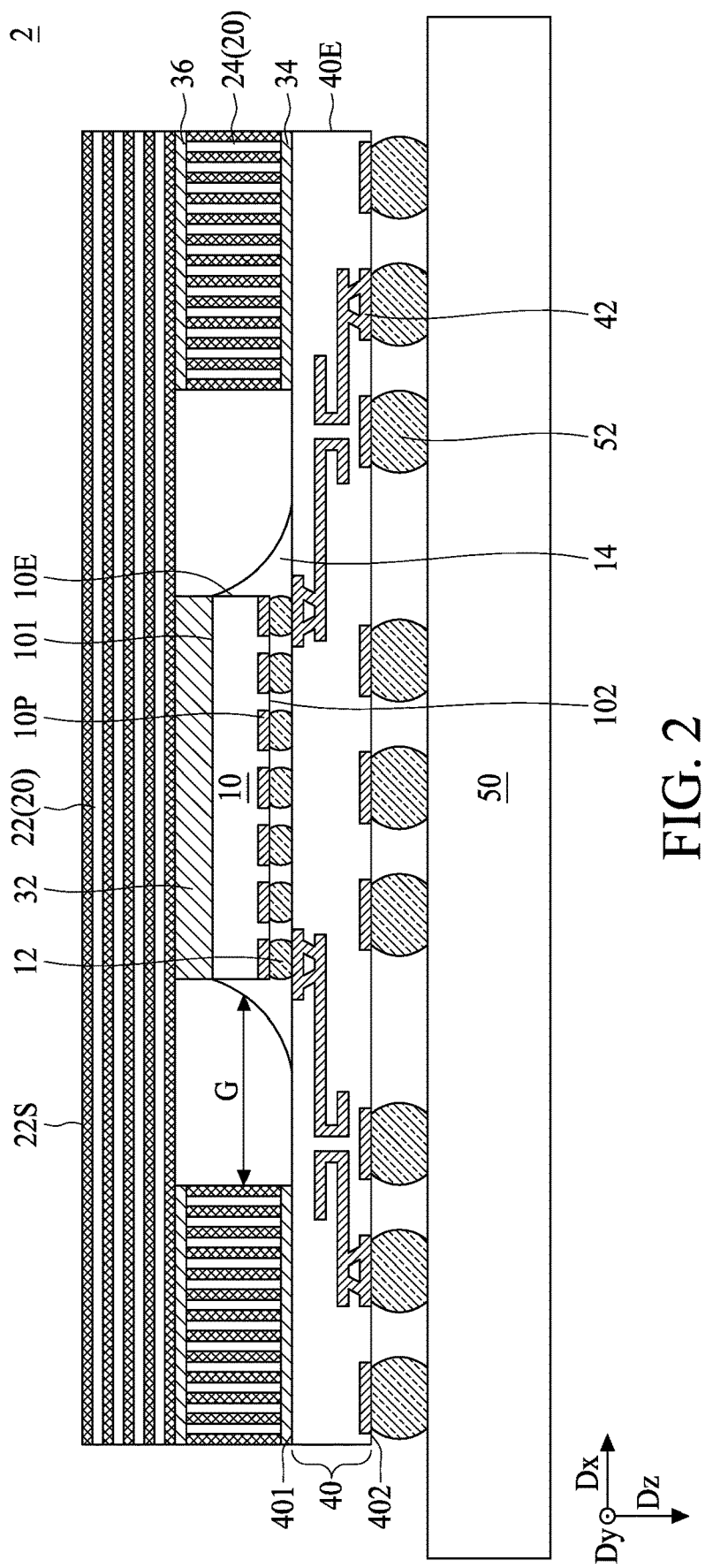
FIG. 2 is a schematic cross-sectional view of a semiconductor device package in accordance with some embodiments of the present disclosure.

FIG. 2 is a schematic cross-sectional view of a semiconductor device package 2 in accordance with some embodiments of the present disclosure. As shown in FIG. 2, in contrast to the semiconductor device package 1, the film stacks of the first thermal conductive section 22 and the second thermal conductive section 24 are stacked in different directions. By way of an example, the film stacks of the first thermal conductive section 22 are stacked substantially in the vertical direction Dz, and the film stacks of the second thermal conductive section 24 are stacked substantially in the lateral direction Dx. Thus, the thermal conductivity of the first thermal conductive section 22 substantially in the lateral direction Dx is larger than that of the first thermal conductive section 22 substantially in the vertical direction Dz, while the thermal conductivity of the second thermal conductive section 24 substantially in the vertical direction Dz is larger than that of the second thermal conductive section 24 substantially in the lateral directions Dx and Dy. Accordingly, heat generated by the semiconductor die 10 can be efficiently transferred from the first thermal conductive section 22 and the second thermal conductive section 24 to the substrate 40. In some embodiments, the first thermal conductive section 22 and the second thermal conductive section 24 are formed individually, and can be connected directly or indirectly through a thermal interface material 36. The thermal interface material 36 may include similar material as the thermal interface material 32 or 34.

Figure 3:
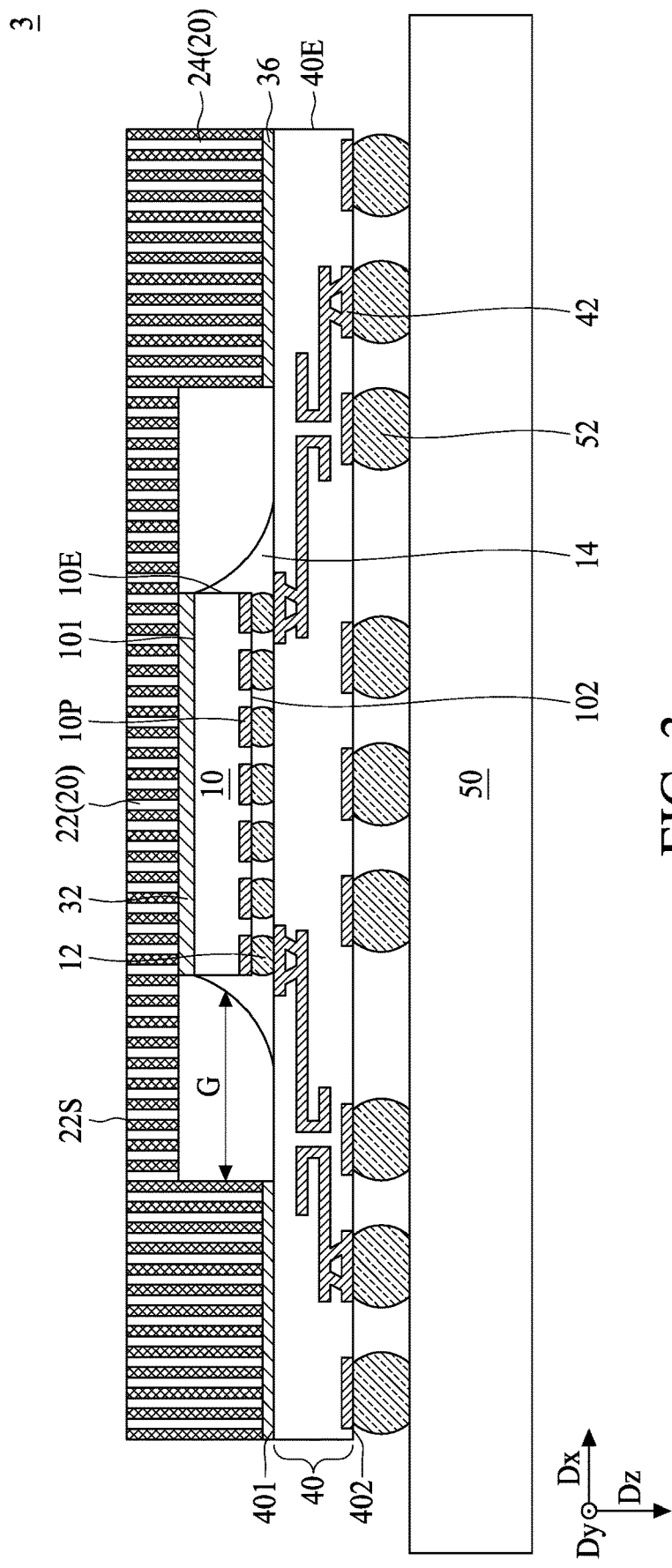
FIG. 3 is a schematic cross-sectional view of a semiconductor device package in accordance with some embodiments of the present disclosure.

FIG. 3 is a schematic cross-sectional view of a semiconductor device package 3 in accordance with some embodiments of the present disclosure. As shown in FIG. 3, the film stacks of the first thermal conductive section 22 and the second thermal conductive section 24 are both stacked in substantially in the lateral direction Dx, for example. Thus, the thermal conductivity of the first thermal conductive section 22 and the thermal conductivity of the second thermal conductive section 24 substantially in the vertical direction Dz are larger than that of the first thermal conductive section 22 and the second thermal conductive section 24 substantially in the lateral direction Dx. Accordingly, a portion of heat generated by the semiconductor die 10 can be efficiently transferred from the first thermal conductive section 22 to the environment or an extra heat dissipation structure disposed on the outer surface 22S of the first thermal conductive section 22. Another portion of heat generated by the semiconductor die 10 can be transferred from the first thermal conductive section 22 and the second thermal conductive section 24 to the substrate 40. In some embodiments, the first thermal conductive section 22 and the second thermal conductive section 24 are formed individually, and can be connected directly or indirectly.

Figure 4:
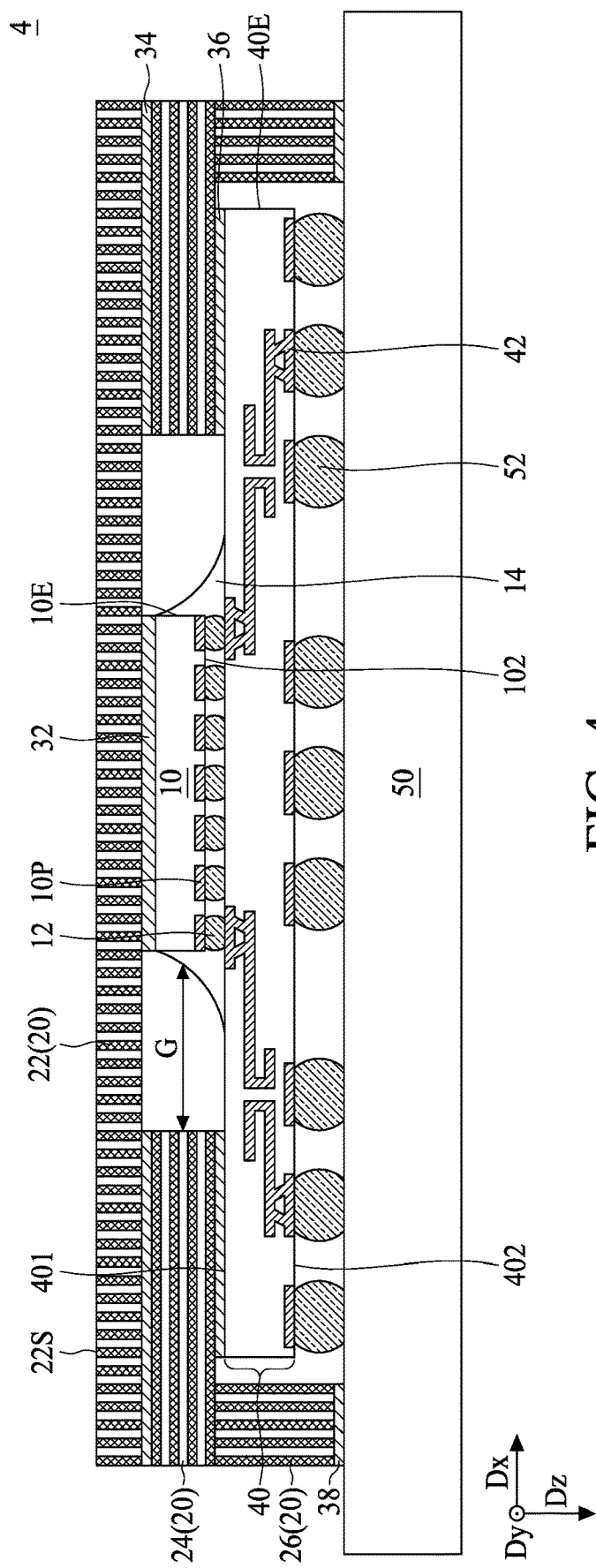
FIG. 4 is a schematic cross-sectional view of a semiconductor device package in accordance with some embodiments of the present disclosure.

FIG. 4 is a schematic cross-sectional view of a semiconductor device package 4 in accordance with some embodiments of the present disclosure. As shown in FIG. 4, in contrast to the semiconductor device package 3, the anisotropic thermal conductive structure 20 of the semiconductor device package 4 may further include a third thermal conductive section 26 adjacent to at least one of the edges 40E of the substrate 40 and connected to the second thermal conductive section 24. In some embodiments, the third thermal conductive section 26 may surround all edges 40E of the substrate 40. The third thermal conductive section 26 can be further connected to the circuit board 50 directly or through a thermal interface material 38. In some embodiments, the film stacks of the first thermal conductive section 22 and the third thermal conductive section 26 can be stacked in the same direction such as substantially in the lateral direction Dx, while the film stacks of the second thermal conductive section 24 can be stacked substantially in a different direction such as the vertical direction Dz. Accordingly, a portion of heat generated by the semiconductor die 10 can be efficiently transferred from the first thermal conductive section 22 to the environment or an extra heat dissipation structure disposed on the outer surface 22S of the first thermal conductive section 22. Another portion of heat generated by the semiconductor die 10 can be transferred from the first thermal conductive section 22 and the second thermal conductive section 24 to the substrate 40, and transferred from the third thermal conductive section 26 to the circuit board 50. In some embodiments, the first thermal conductive section 22, the second thermal conductive section 24 and the third thermal conductive section 26 can be formed individually, and can be connected directly or indirectly.

Figure 5:
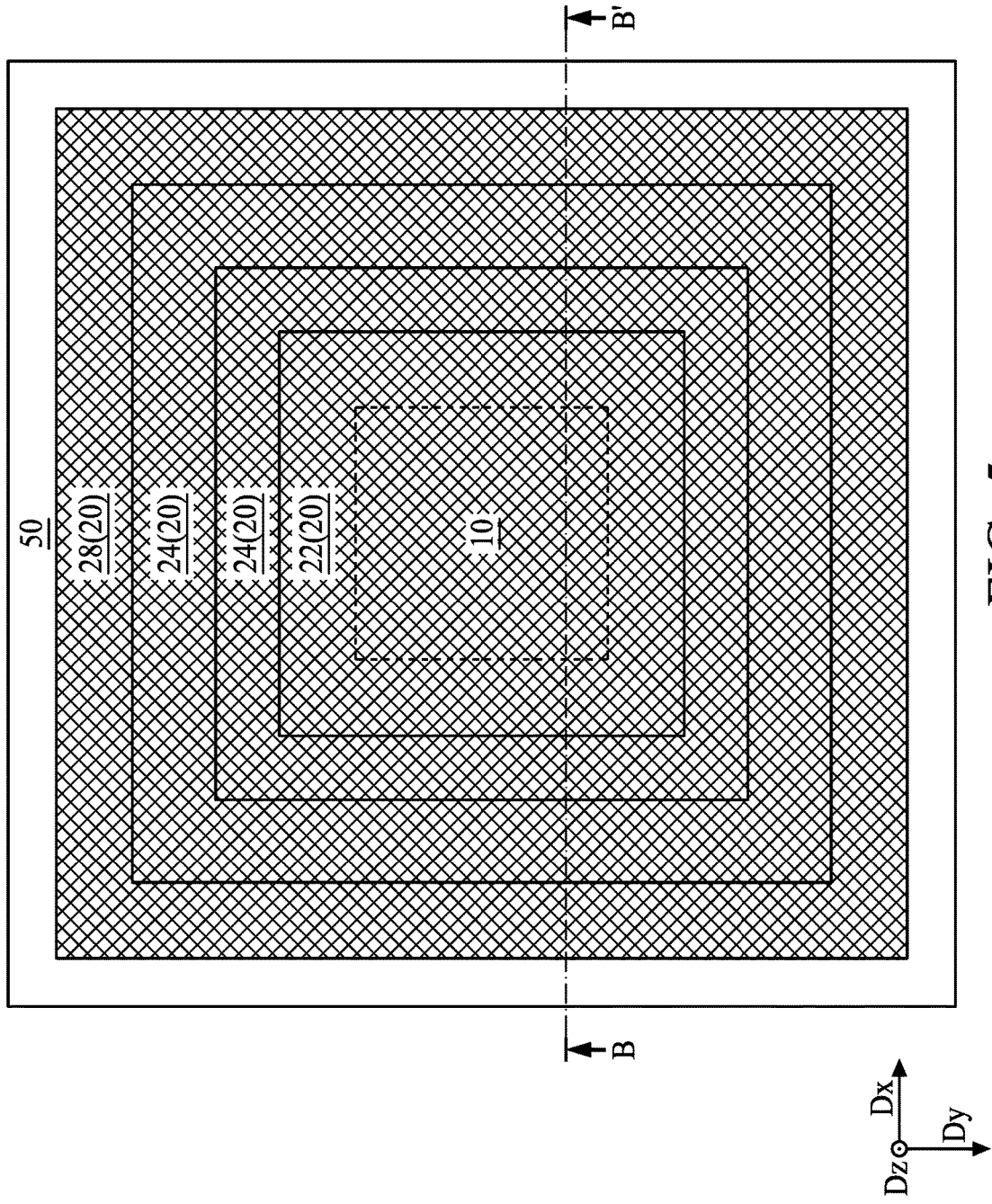
FIG. 5 is a schematic top view of a semiconductor electronic device package in accordance with some embodiments of the present disclosure.
Figure 5A:
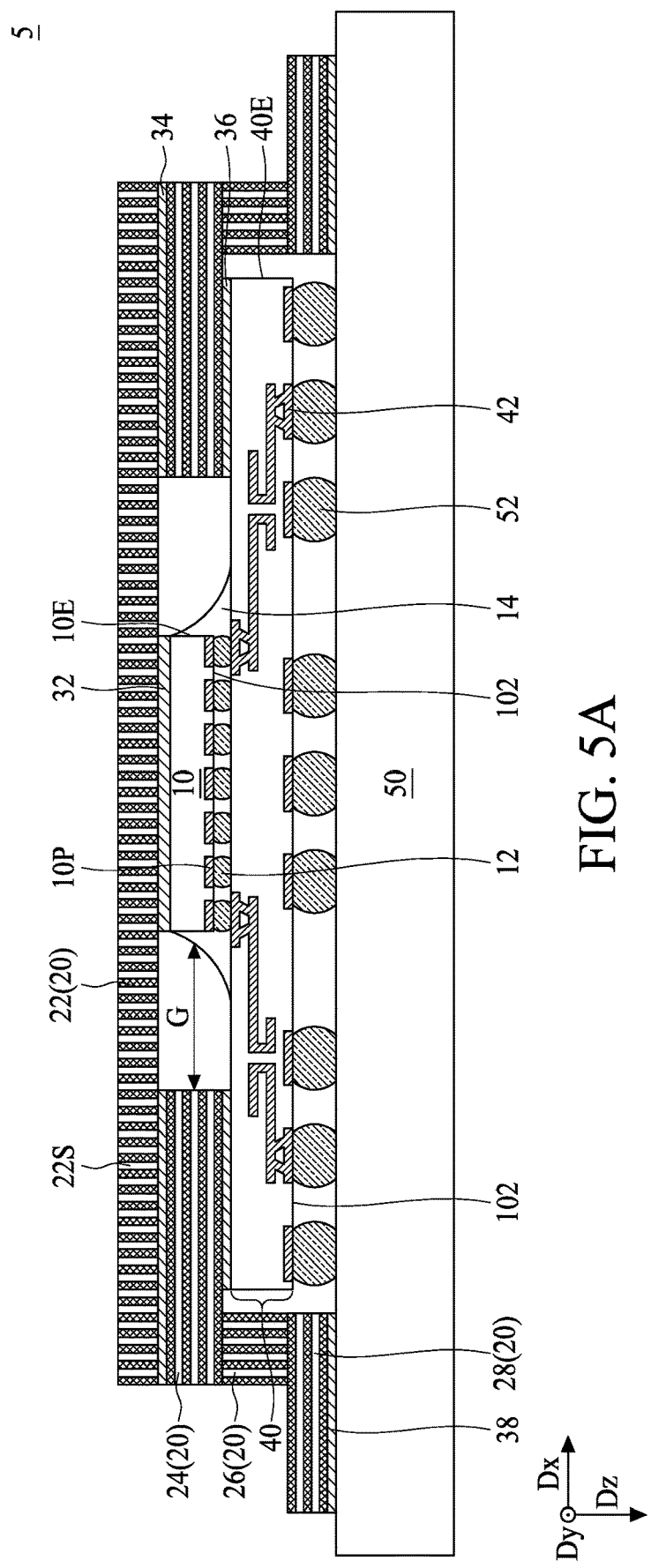
FIG. 5A is a schematic cross-sectional view of a semiconductor device package taken in a line B-B' in FIG. 5.

FIG. 5 is a schematic top view of a semiconductor electronic device package 5 in accordance with some embodiments of the present disclosure, and FIG. 5A is a schematic cross-sectional view of a semiconductor device package 5 taken in a line B-B' in FIG. 5. As shown in FIG. 5 and FIG. 5A, in contrast to the semiconductor device package 4, the anisotropic thermal conductive structure 20 of the semiconductor device package 5 may further include a fourth thermal conductive section 28 disposed on the circuit board 50 and connected to the third thermal conductive section 26. The film stacks of the fourth thermal conductive section 28 are stacked substantially in the vertical direction Dz, such that the thermal conductivity of the fourth thermal conductive section 28 in the lateral direction Dx is larger than that in the vertical direction Dz. The fourth thermal conductive section 28 extends in the lateral direction Dx, and thus the overlapping area between the fourth thermal conductive section 28 and the circuit board 50 can be enlarged. Accordingly, heat transfer from the fourth thermal conductive section 28 to the circuit board 50 can be increased. In some embodiments, the second thermal conductive section 24 includes a ring structure connecting the first thermal conductive section 22 and surrounding all the edges 10E of the semiconductor die 10, and the fourth thermal conductive section 28 includes a ring structure connecting the third thermal conductive section 26 and surrounding all the edges 40E of the substrate 40. The film stacks of the first thermal conductive section 22, the second thermal conductive section 24, the third thermal conductive section 26 and the fourth thermal conductive section 28 are alternate, and thus heat generated by the semiconductor die 10 can be transferred in an efficient way from different sections of the anisotropic thermal conductive structure 20 to the substrate 40 and the circuit board 50.

Figure 6:
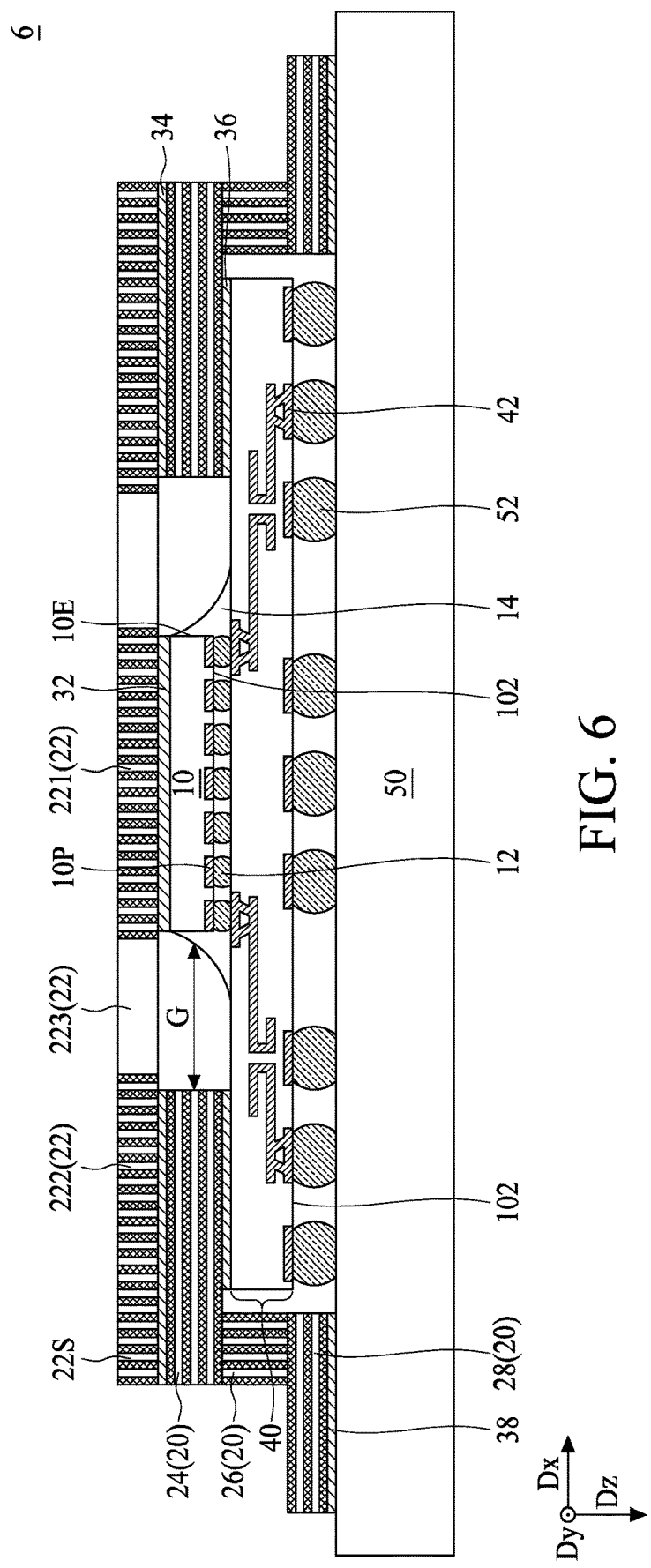
FIG. 6 is a schematic cross-sectional view of a semiconductor device package in accordance with some embodiments of the present disclosure.

FIG. 6 is a schematic cross-sectional view of a semiconductor device package 6 in accordance with some embodiments of the present disclosure. As shown in FIG. 6, in contrast to the semiconductor device package 5, the first thermal conductive section 22 of the semiconductor device package 6 may include one or more first portions 221 and one or more second portions 222 connected to each other by one or more connection portions 223. The first portion 221, the second portion 222 and the connection portion 223 may be disposed substantially at the same level, forming a lid. The material of the connection portion 223 is different from that of the first portion 221 and the second portion 222. In some embodiments, the material of the connection portion 223 may include a thermal interface material, an adhesive material or an insulation material such as rubber. In some embodiments, the connection portion 223 may include a hollow space connected to pipe(s). The hollow space may be in communication with an extra heat dissipation structure through the pipe(s) such that cooling medium can be circulated around the semiconductor die 10. By way of examples, an air cooling structure or a water cooling structure can be connected to the connection portion 223 such that air or water can be circulated around the semiconductor die 10 to increase heat dissipation effect. Meanwhile, the anisotropic thermal conductive structure 20 can still provide heat dissipation.

Figure 7:
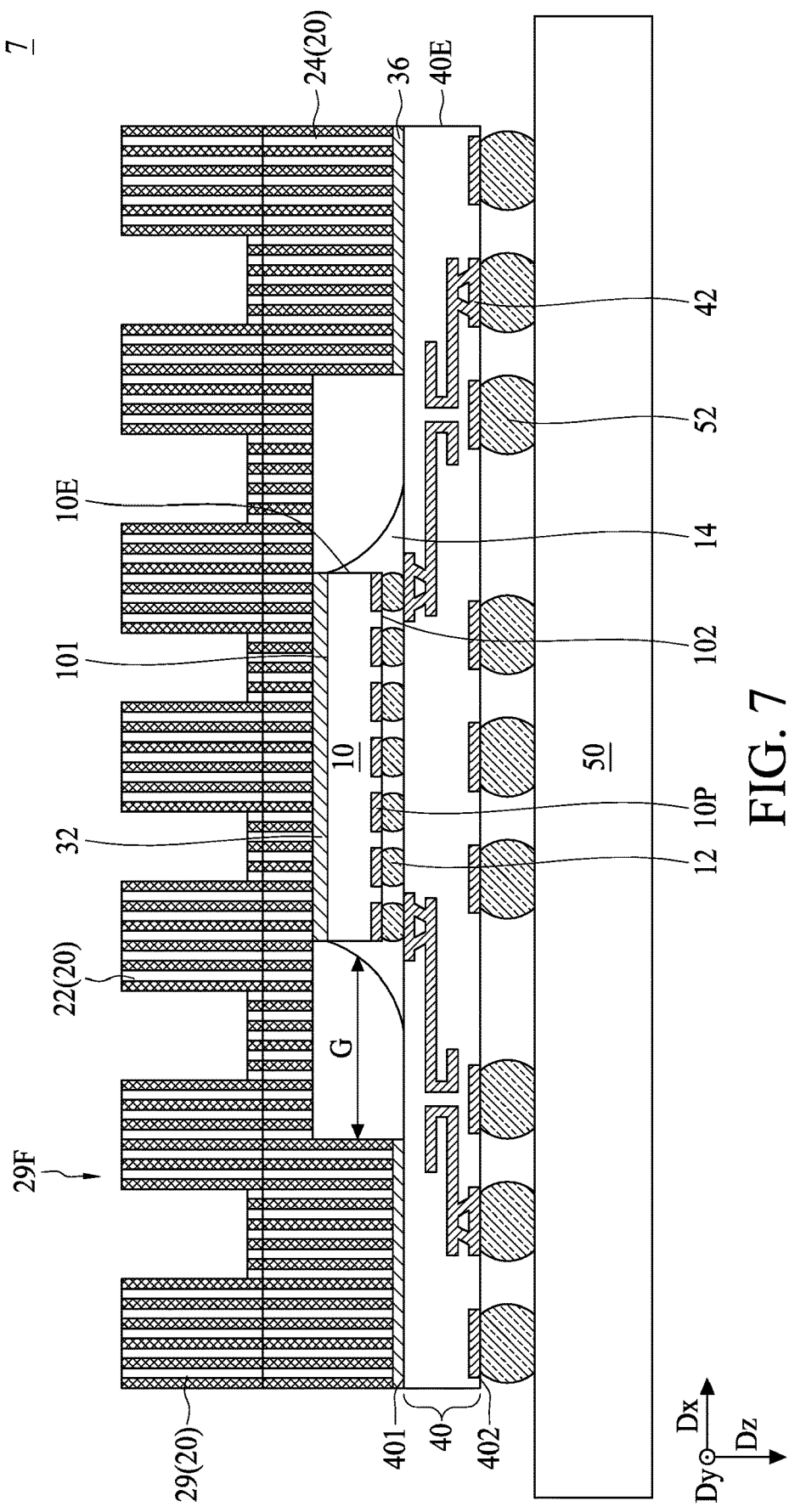
FIG. 7 is a schematic cross-sectional view of a semiconductor device package in accordance with some embodiments of the present disclosure.

FIG. 7 is a schematic cross-sectional view of a semiconductor device package 7 in accordance with some embodiments of the present disclosure. As shown in FIG. 7, the anisotropic thermal conductive structure 20 of the semiconductor device package 6 may further include a top thermal conductive section 29 disposed on the first thermal conductive section 22. In some embodiments, the top thermal conductive section 29 may include a plurality of fin structures 29F. The fin structures 29 may be exposed to the environment. The film stacks of the top thermal conductive section 29 may be stacked substantially in the lateral direction Dx or substantially in the vertical direction Dz. The fin structures 29F can increase an outer area of the top thermal conductive section 29, and thus enhance heat dissipation effect. The top thermal conductive section 29 can be integrated into any of the semiconductor device packages in the afore-mentioned embodiments of the present disclosure.

Figure 8:
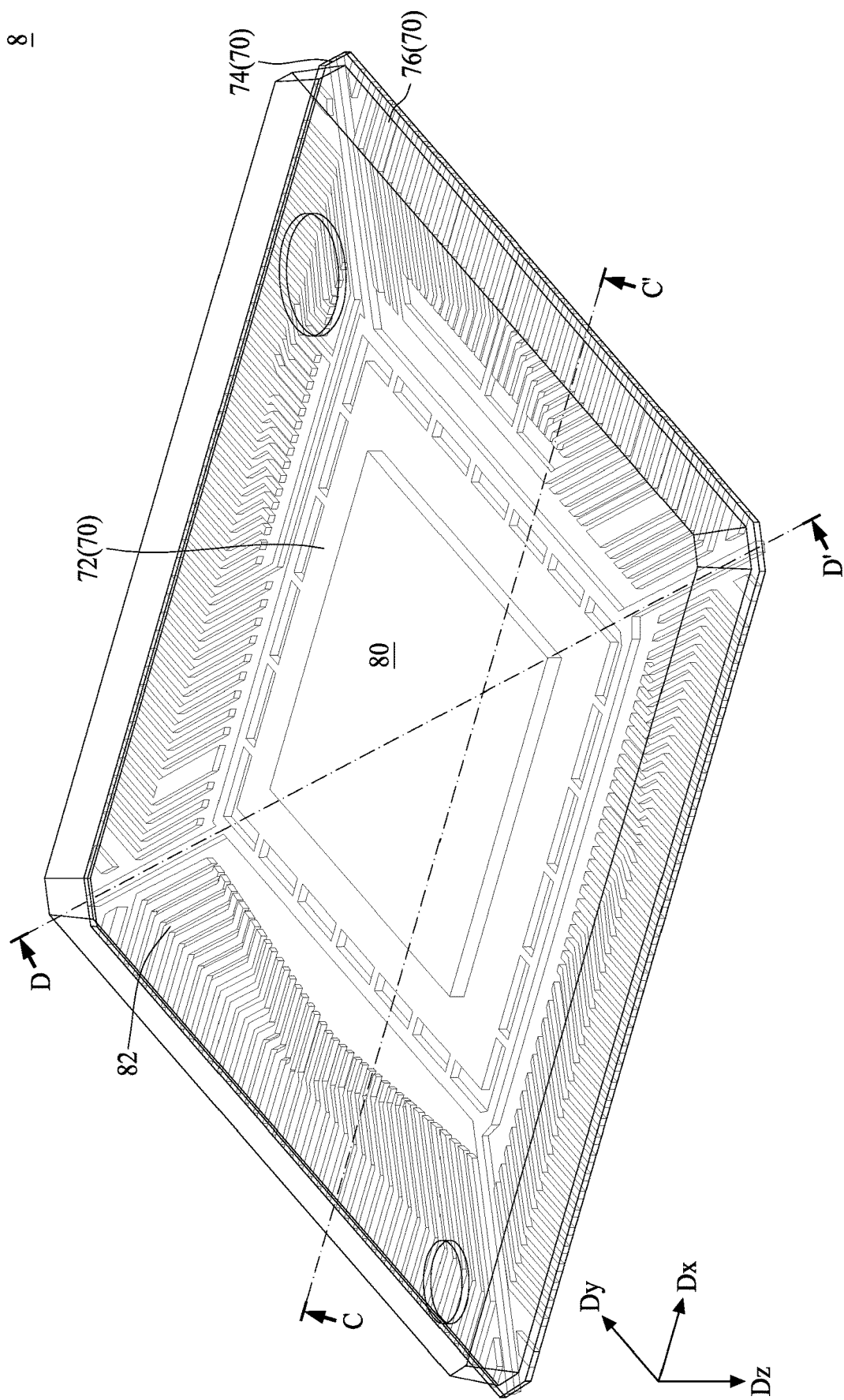
FIG. 8 is a schematic perspective view of a semiconductor electronic device package in accordance with some embodiments of the present disclosure.
Figure 8A:
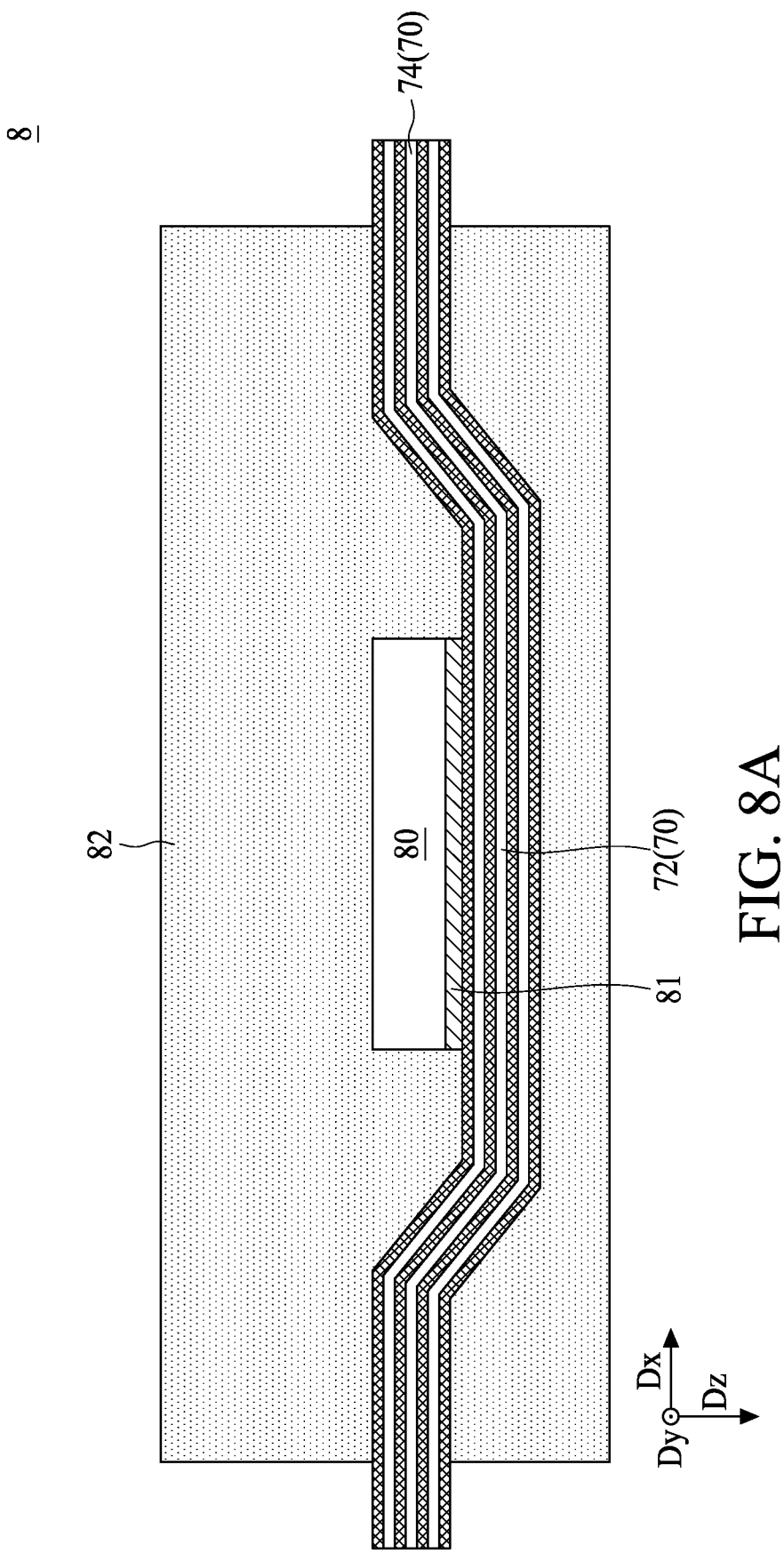
FIG. 8A is a schematic cross-sectional view of a semiconductor device package taken in a line C-C' in FIG. 8.
Figure 8B:
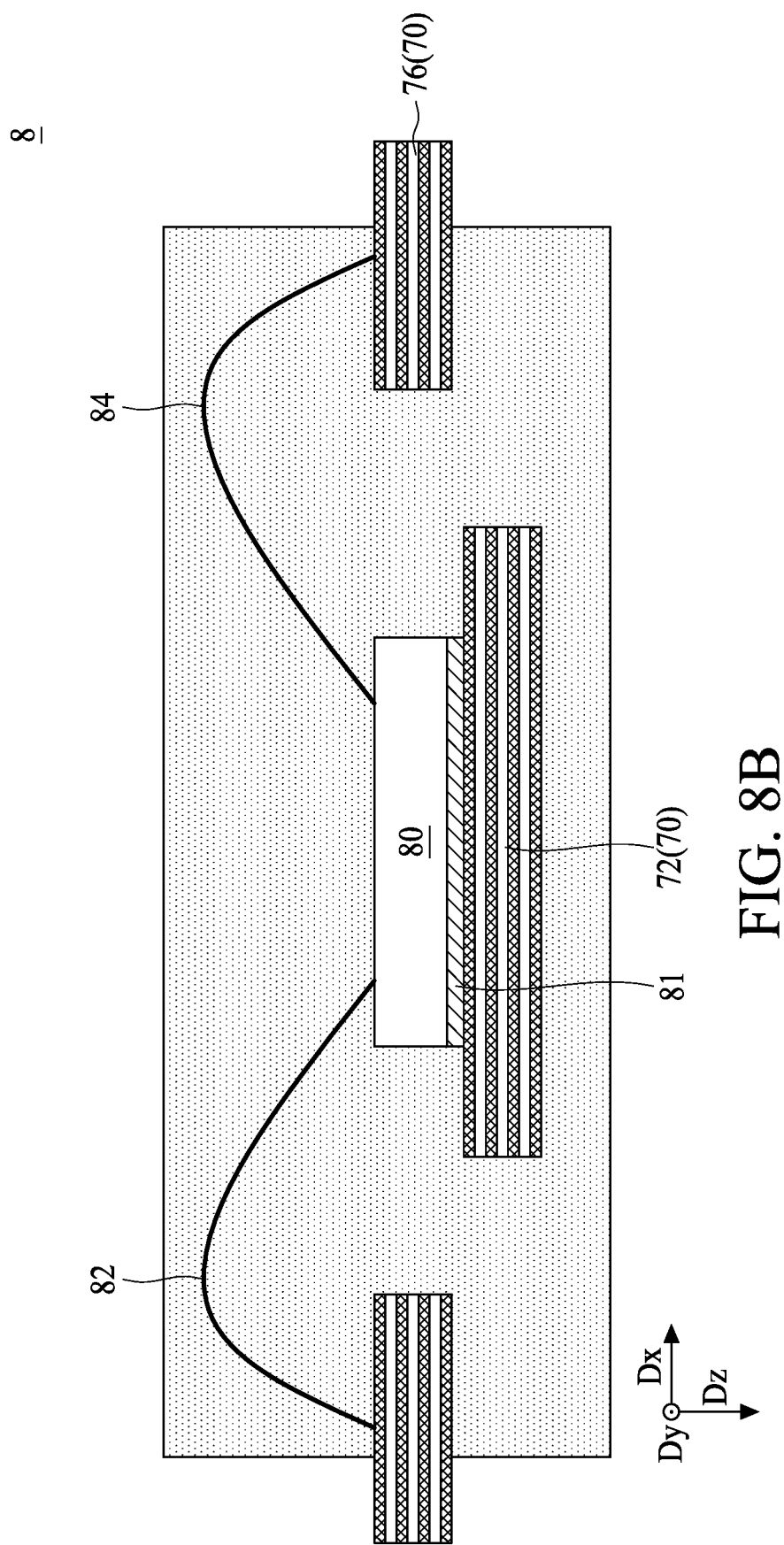
FIG. 8B is a schematic cross-sectional view of a semiconductor device package taken in a line D-D' in FIG. 8.

FIG. 8 is a schematic perspective view of a semiconductor electronic device package 8 in accordance with some embodiments of the present disclosure, FIG. 8A is a schematic cross-sectional view of a semiconductor device package 8 taken in a line C-C' in FIG. 8, and FIG. 8B is a schematic cross-sectional view of a semiconductor device package 8 taken in a line D-D' in FIG. 8. As shown in FIG. 8, FIG. 8A and FIG. 8B, the semiconductor device package 8 includes a lead frame 70, a semiconductor die 80 and an encapsulant 82. The lead frame 70 includes a die pad 72, a plurality of supporting bars 74 extending from the die pad 72, and a plurality of fingers 76 spaced apart the die pad 72. The material of the lead frame 70 may be the same as that of the anisotropic thermal conductive structure 20 as described in the above descriptions. For example, the lead frame 70 may include at least two pairs of film stacks, and each pair of the film stacks of the lead frame 70 may include a metal film and a nano-structural film alternately stacked as illustrated in FIG. 1B. The semiconductor die 80 is disposed on the die pad 72 by a thermal interface material 81 such as a die attach film (DAF), and electrically connected to the fingers 76 through bond wires 84, for example. The encapsulant 82 encapsulates the lead frame 70 and the semiconductor die 80. The encapsulant 82 may include a molding compound. In some embodiments, the film stacks of the lead frame 70 are stacked substantially in the vertical direction Dz, and thus a thermal conductivity of the lead frame 70 substantially in a lateral direction Dx or Dy is larger than that of the lead frame 70 substantially in the vertical direction Dz. Accordingly, heat generated by the semiconductor die 80 can be efficiently transferred from the die pad 72 to the supporting bars 74.

Figure 9A:
Figure 9B:
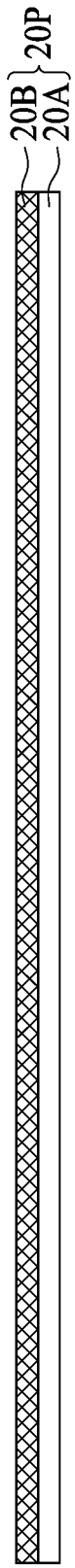
Figure 9C:
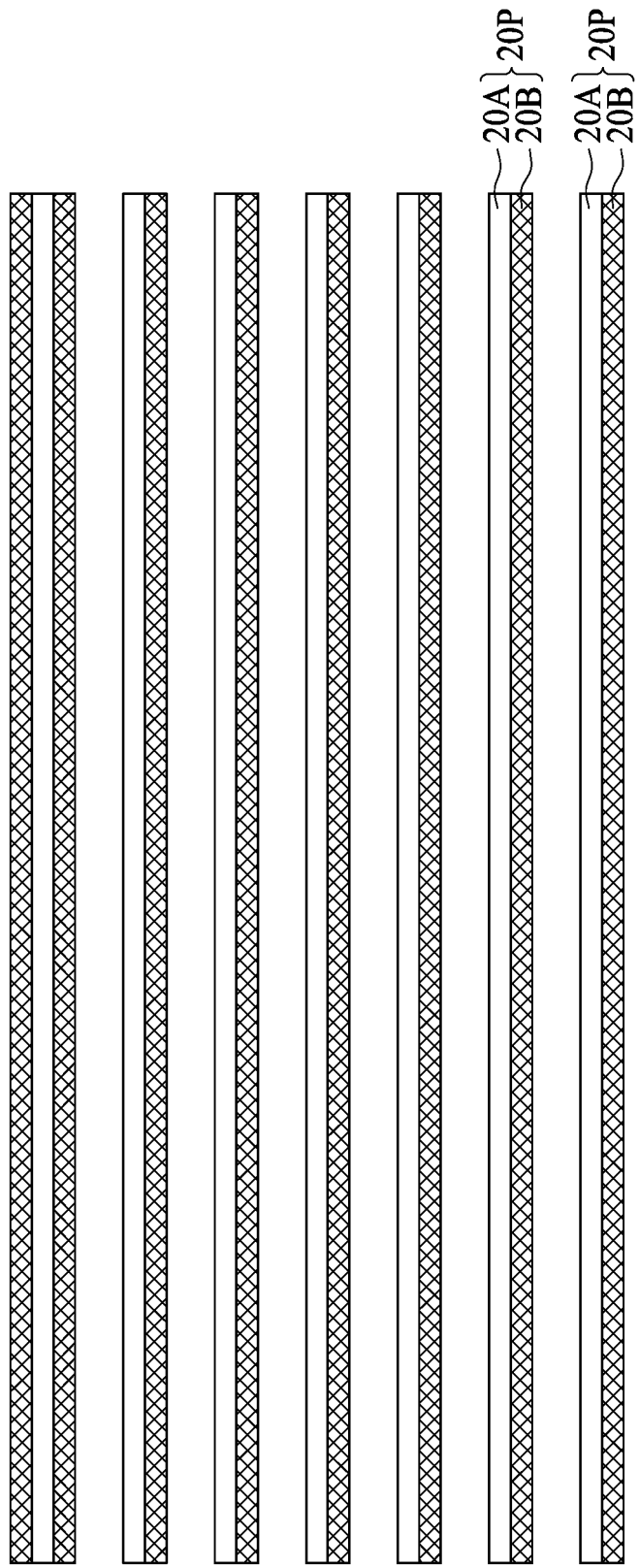
Figure 9D:
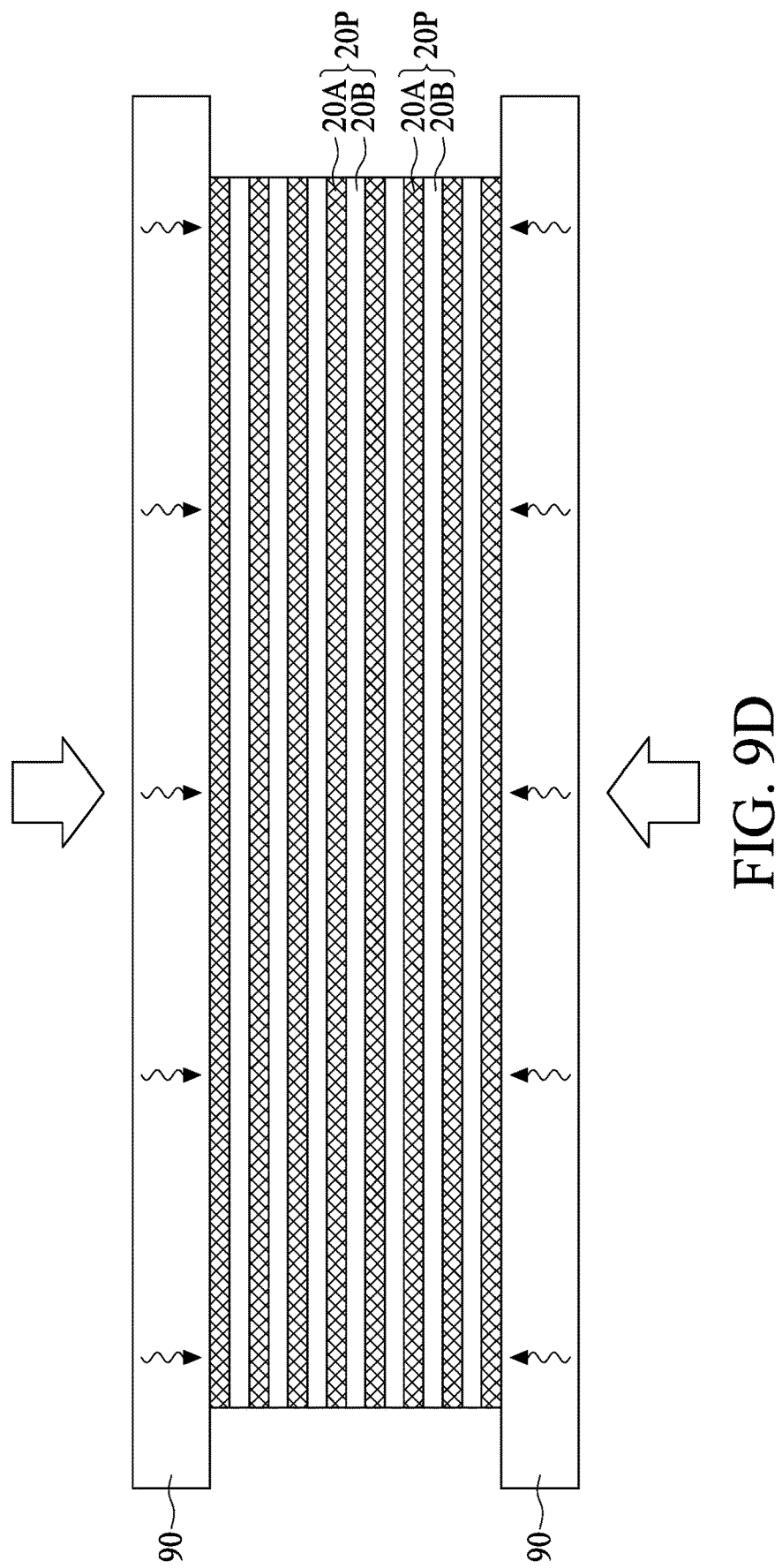

FIG. 9A, FIG. 9B, FIG. 9C, FIG. 9D, FIG. 9E, FIG. 9F and FIG. 9G illustrate operations of manufacturing a semiconductor electronic device package in accordance with some embodiments of the present disclosure. As shown in FIG. 9A, a metal film 20A such as a copper foil is provided. The metal film 20A can be formed by sputtering or any suitable techniques. The metal film 20A may be shaped to predetermined shape and size. As shown in FIG. 9B, a nano-structural film 20B such as a graphene film is formed on the metal film 20A to form a pair 20P of film stacks. In some embodiments, the nano-structural film 20B can be formed by chemical vapor deposition (CVD) or any suitable techniques. As shown in FIG. 9C, a plurality of pairs 20P are laminated on each other with the nano-structural films 20B facing down. In some embodiments, the two sides of the metal film 20A of the upmost pair 20P are both covered by the nano-structural films 20B. As shown in FIG. 9D, the pairs 20P of film stacks are pressed, for example by hot plates 90 to make the pairs 20P of film stacks connected firmly to one another, forming a multi-layered stacking structure 100. The multi-layered stacking structure 100 may be used to form the anisotropic thermal conductive structures or lead frames as described in the present disclosure.

Figure 9E:
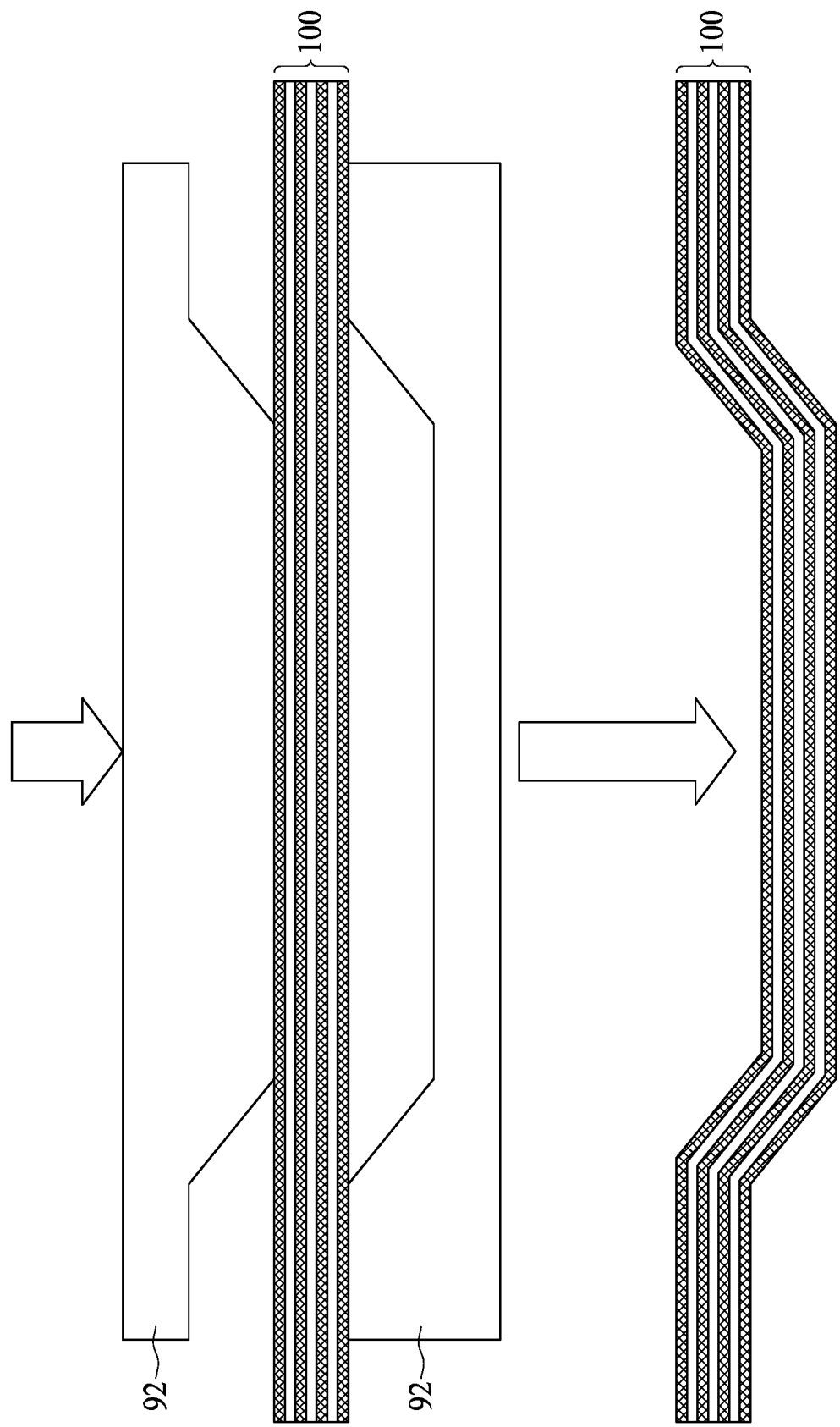

In some embodiments, the multi-layered stacking structure 100 can be stamped or forged by a tool 92 such as stamping die or forging die as shown in FIG. 9E to form the anisotropic thermal conductive structure 20 as illustrated in FIG. 1A or the lead frame 70 as illustrated in FIG. 8.

In some other embodiments, the multi-layered stacking structure 100 can be rotated by 90 degrees, and cut into a plurality of slices 100S as shown in FIG. 9F. The slice 100S of the multi-layered stacking structure 100 can be further pressed or grinded to reduce its thickness. The slices 100S can be used to form any sections of the anisotropic thermal conductive structure with laterally stacking films. By way of examples, the slice 100S can be used to form the second thermal conductive section 24 in FIG. 2; the first thermal conductive section 22 and the second thermal conductive section 24 in FIG. 3; the first thermal conductive section 22 and the third thermal conductive section 26 in FIG. 4; the first thermal conductive section 22 and the third thermal conductive section 26 in FIG. 5A; the first portion 221 and the second portion 222 of the first thermal conductive section 22 and the third thermal conductive section 26 in FIG. 6; and the first thermal conductive section 22 and the second thermal conductive section 24 in FIG. 7.

Figure 9G:
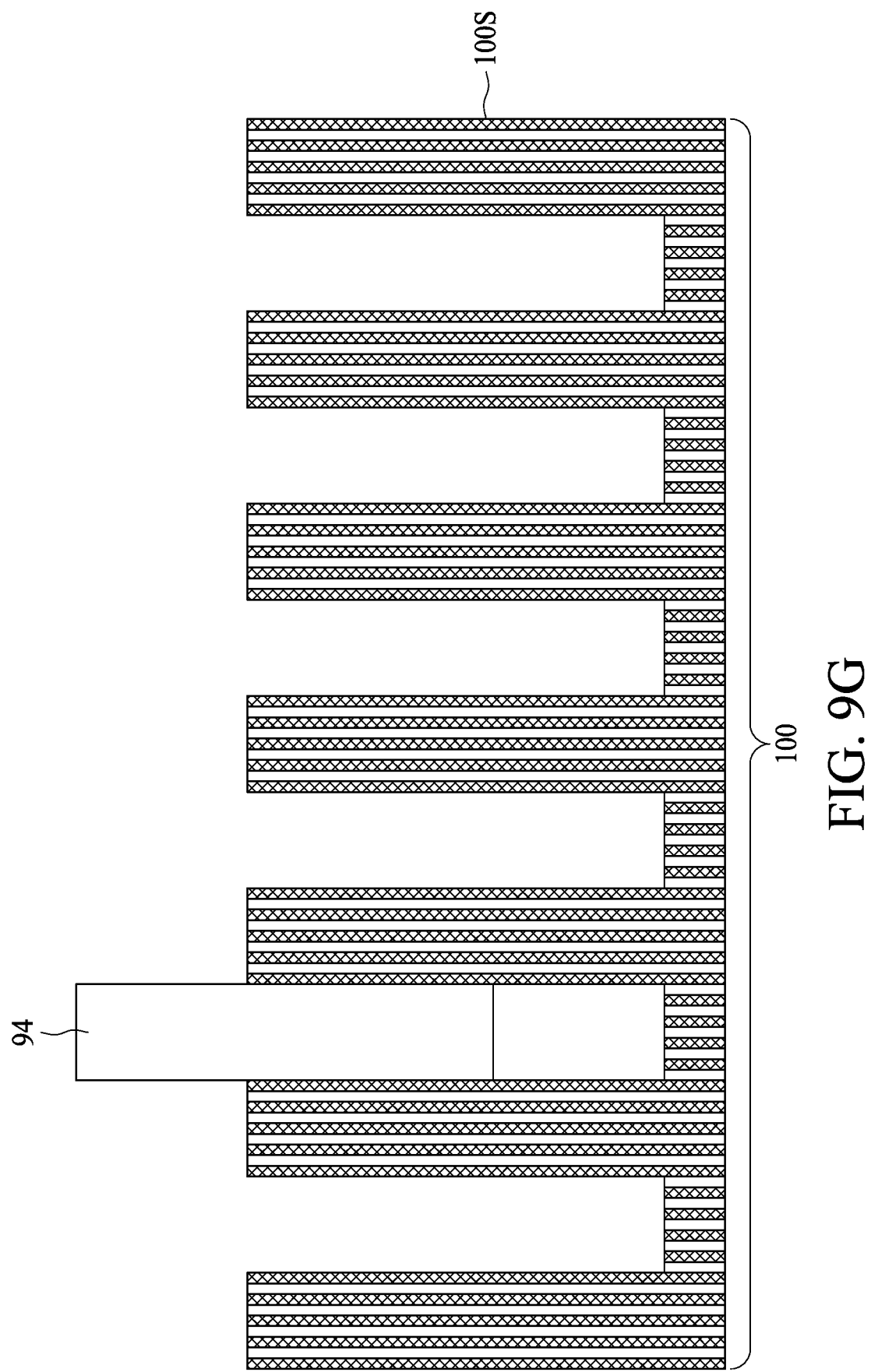

In some embodiments, the slice 100S of the multi-layered stacking structure 100 can be processed by a milling tool 94 as shown in FIG. 9G to form the top thermal conductive section 29 as shown in FIG. 7.

In some embodiments of the present disclosure, the anisotropic thermal conductive structure have anisotropic thermal conductive characteristic that helps transfer heat from the semiconductor die in a more efficient way with less thermal resistance, and thus heat dissipation of the semiconductor device package can be improved.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
    a semiconductor die including a first surface, a second surface opposite to the first surface and edges connecting the first surface to the second surface; and
    an anisotropic thermal conductive structure having different thermal conductivities in different directions, wherein the anisotropic thermal conductive structure comprises at least two pairs of film stacks, and each pair of the film stacks comprises a metal film and a nano-structural film alternately stacked,
    wherein the anisotropic thermal conductive structure comprises a first thermal conductive section disposed on the first surface of the semiconductor die, and the first thermal conductive section is wider than the semiconductor die.

2. The semiconductor device package of claim 1, further comprising a thermal interface material (TIM) disposed between the first surface of the semiconductor die and the first thermal conductive section.

3. The semiconductor device package of claim 1, wherein a thermal conductivity of the first thermal conductive section substantially in a vertical direction perpendicular to the first surface of the semiconductor die is different from that of the first thermal conductive section substantially in a lateral direction.

4. The semiconductor device package of claim 3, wherein the film stacks of the first thermal conductive section are stacked substantially in the lateral direction.

5. The semiconductor device package of claim 4, wherein an outer surface of the first thermal conductive section is exposed to environment.

6. The semiconductor device package of claim 4, wherein the anisotropic thermal conductive structure further comprises a second thermal conductive section adjacent to at least one of the edges of the semiconductor die, and the second thermal conductive section and the at least one of the edges of the semiconductor die are spaced with a gap.

7. The semiconductor device package of claim 6, wherein the film stacks of the second thermal conductive section are stacked substantially in the vertical direction.

8. The semiconductor device package of claim 6, wherein the second thermal conductive section comprises a ring structure connecting the first thermal conductive section and surrounding the edges of the semiconductor die.

9. The semiconductor device package of claim 6, further comprising a substrate disposed on the second surface of the semiconductor die, wherein the substrate includes a top surface connected to the second thermal conductive section, a bottom surface opposite to the top surface, and edges connecting the top surface to the bottom surface.

10. The semiconductor device package of claim 6, further comprising a thermal interface material disposed between the first thermal conductive section and the second thermal conductive section.

11. The semiconductor device package of claim 9, wherein the anisotropic thermal conductive structure further comprises a third conductive section disposed on at least one of the edges of the substrate and connected to the second thermal conductive section.

12. The semiconductor device package of claim 11, wherein the film stacks of the third thermal conductive section are stacked substantially in the lateral direction.

13. The semiconductor device package of claim 11, further comprising:
    a circuit board disposed on the bottom surface of the substrate;
    a plurality of electrical conductors disposed between and electrically connected to the substrate and the circuit board; and
    a fourth thermal conductive section disposed on the circuit board and connected to the third thermal conductive section.

14. The semiconductor device package of claim 13, wherein the film stacks of the fourth thermal conductive section are stacked substantially in the vertical direction.

15. The semiconductor device package of claim 1, wherein the metal film comprises a copper film, and the nanostructural film comprises a graphene film.

16. A semiconductor device package, comprising:
    a semiconductor die including a first surface, a second surface opposite to the first surface and edges connecting the first surface to the second surface;
    a first thermal conductive section disposed on the first surface of the semiconductor die, wherein the first thermal conductive section comprises at least two pairs of film stacks, and each pair of the film stacks of the first thermal conductive section comprises a metal film and a nano-structural film alternately stacked; and a second thermal conductive section adjacent to at least one of the edges of the semiconductor die and connected to the first thermal conductive section.

17. The semiconductor device package of claim 16, wherein the second thermal conductive section comprises at least two pairs of film stacks, and each pair of the film stacks of the second thermal conductive section comprises a metal film and a nano-structural film alternately stacked.

18. The semiconductor device package of claim 17, wherein the film stacks of the second thermal conductive section and the film stacks of the first thermal conductive section are stacked in a same direction or in different directions.

19. The semiconductor device package of claim 16, wherein the metal film comprises a copper film, and the nanostructural film comprises a graphene film.

20. The semiconductor device package of claim 16, further comprising a thermal interface material disposed between the first thermal conductive section and the second thermal conductive section.

* * * * *